(12) United States Patent
Hedler et al.

(10) Patent No.: US 7,847,415 B2
(45) Date of Patent: Dec. 7, 2010

(54) METHOD FOR MANUFACTURING A MULTICHIP MODULE ASSEMBLY

(75) Inventors: Harry Hedler, Germering (DE); Roland Irsigler, Munich (DE)

(73) Assignee: Qimonda AG, Munich (DE)

( * ) Notice: Subject to any disclaimer, the term of this patent is extended or adjusted under 35 U.S.C. 154(b) by 318 days.

(21) Appl. No.: 12/175,726

(22) Filed: Jul. 18, 2008

(65) Prior Publication Data
US 2010/0013101 A1  Jan. 21, 2010

(51) Int. Cl.
*H01L 23/52* (2006.01)
*H01L 23/48* (2006.01)
*H01L 29/40* (2006.01)

(52) U.S. Cl. .............................. 257/777; 257/E21.614; 257/685; 257/686; 257/723; 438/108

(58) Field of Classification Search .......... 257/E21.614, 257/E23.141, E25.013, E25.018, 685, 686, 257/723–726, 773, 777; 438/108, 109; 361/760
See application file for complete search history.

(56) References Cited

U.S. PATENT DOCUMENTS

| | | | |
|---|---|---|---|
| 5,399,898 A * | 3/1995 | Rostoker | 257/499 |
| 6,407,456 B1 * | 6/2002 | Ball | 257/777 |
| 6,509,638 B2 * | 1/2003 | Fujimoto et al. | 257/686 |
| 6,614,104 B2 * | 9/2003 | Farnworth et al. | 257/686 |
| 6,650,008 B2 * | 11/2003 | Tsai et al. | 257/686 |
| 6,841,881 B2 * | 1/2005 | Katagiri et al. | 257/777 |
| 6,984,889 B2 * | 1/2006 | Kimura | 257/723 |
| 7,098,542 B1 * | 8/2006 | Hoang et al. | 257/778 |
| 7,215,016 B2 * | 5/2007 | Wang | 257/686 |
| 7,413,928 B2 * | 8/2008 | Doan | 438/109 |
| 7,554,203 B2 * | 6/2009 | Zhou et al. | 257/777 |
| 2006/0220262 A1 | 10/2006 | Meyer et al. | |

* cited by examiner

*Primary Examiner*—Chris Chu
(74) *Attorney, Agent, or Firm*—Slater & Matsil, L.L.P.

(57) ABSTRACT

A multichip module assembly includes a chipset of at least two chips. The chips have active sides, rear sides and chip contacts on their active sides adjacent each other and are embedded in a polymer matrix in a symmetrical manner relating to the top and the bottom surface of the chipset. Chip contacts are electrically connected by through polymer connectors that each extend from a chip contact to a surface of the polymer matrix. A film wiring line is arranged on a side of the polymer matrix for electrical connection of two through polymer connectors of two chips or a through polymer connector with an interconnect element arranged on a side of the polymer matrix.

25 Claims, 15 Drawing Sheets

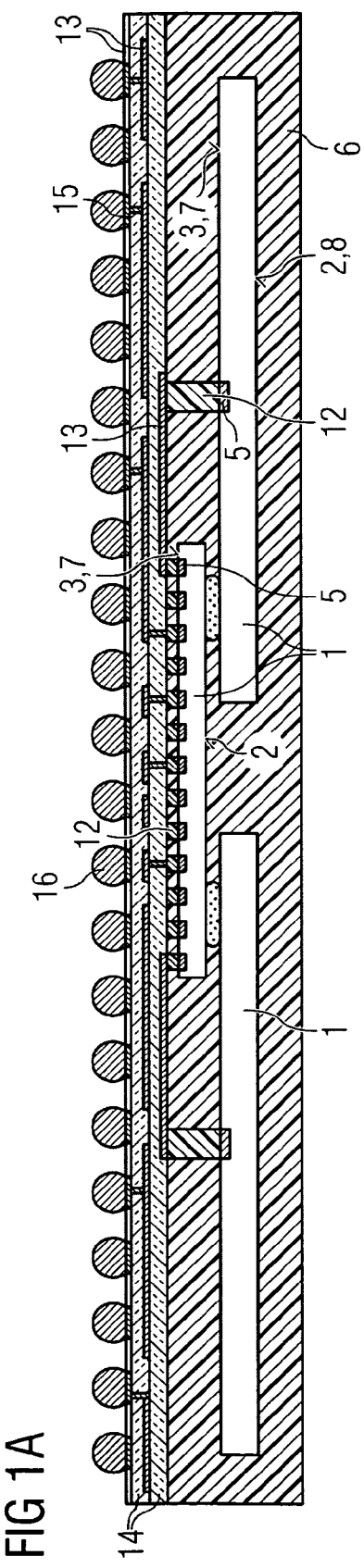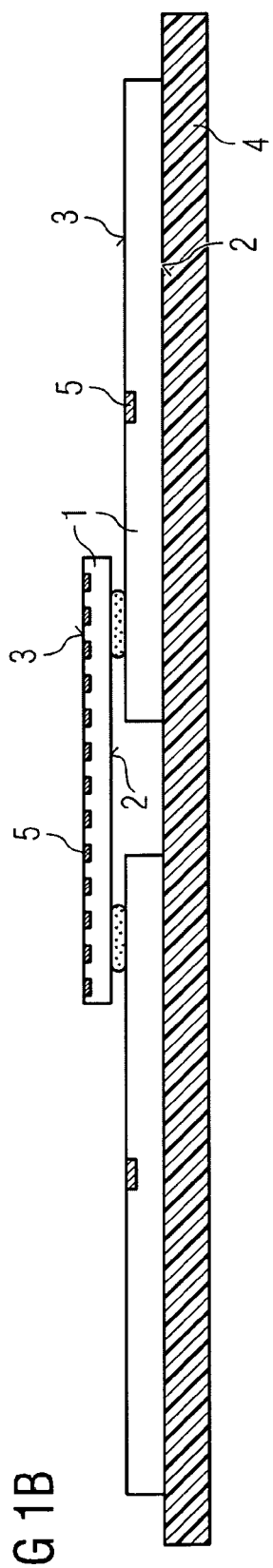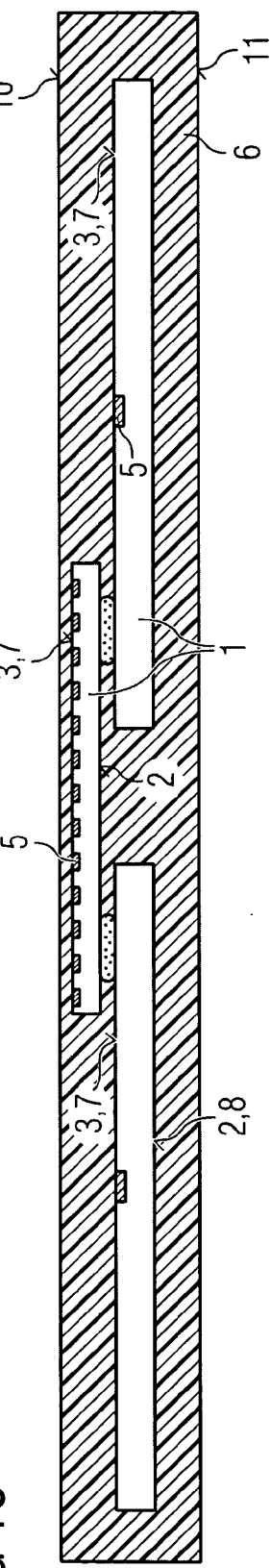

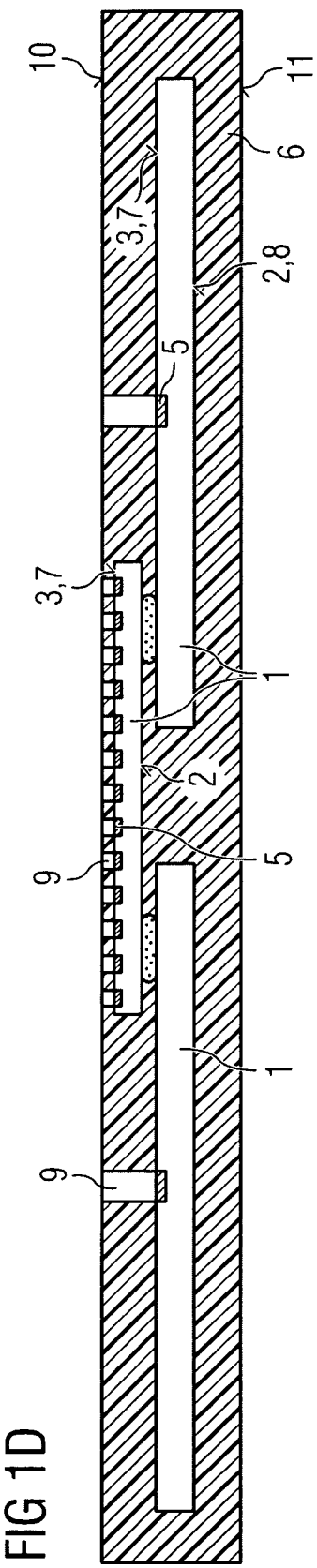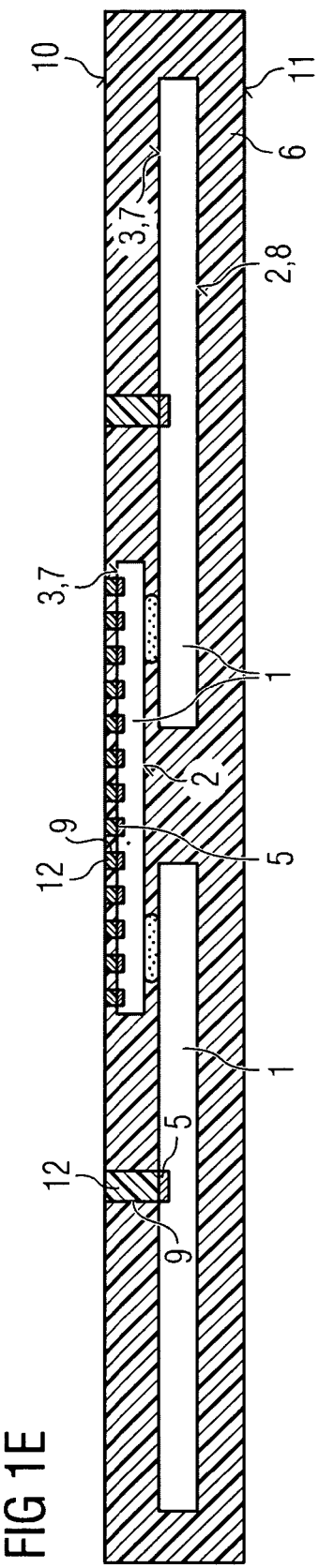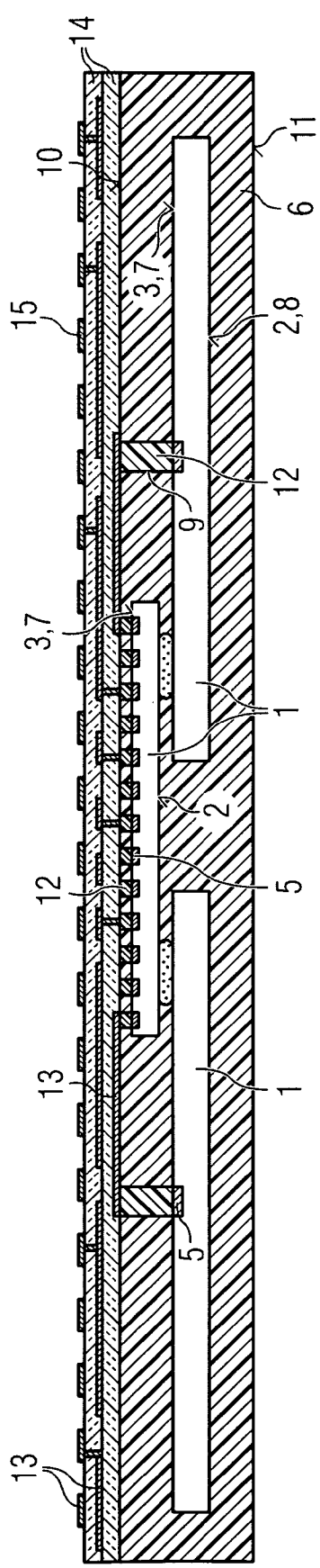

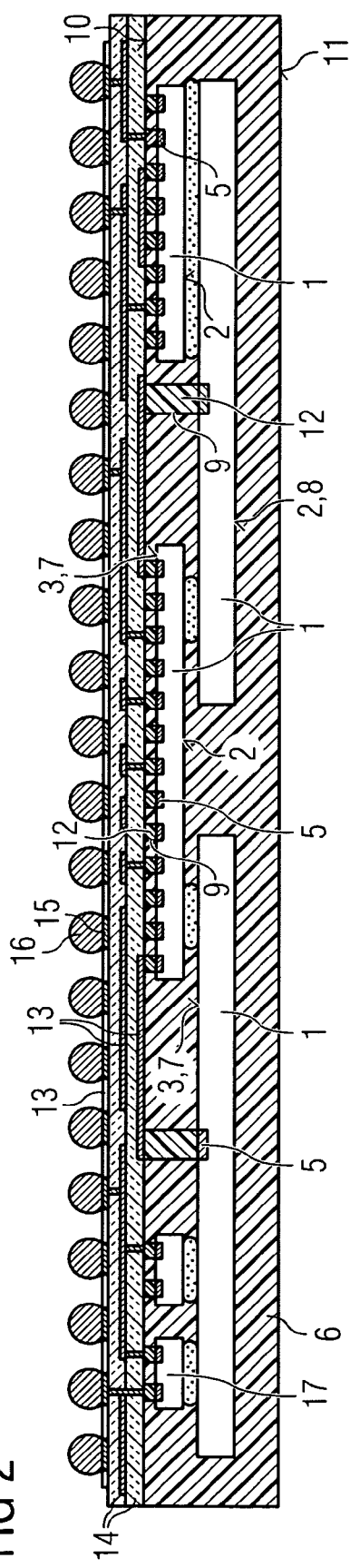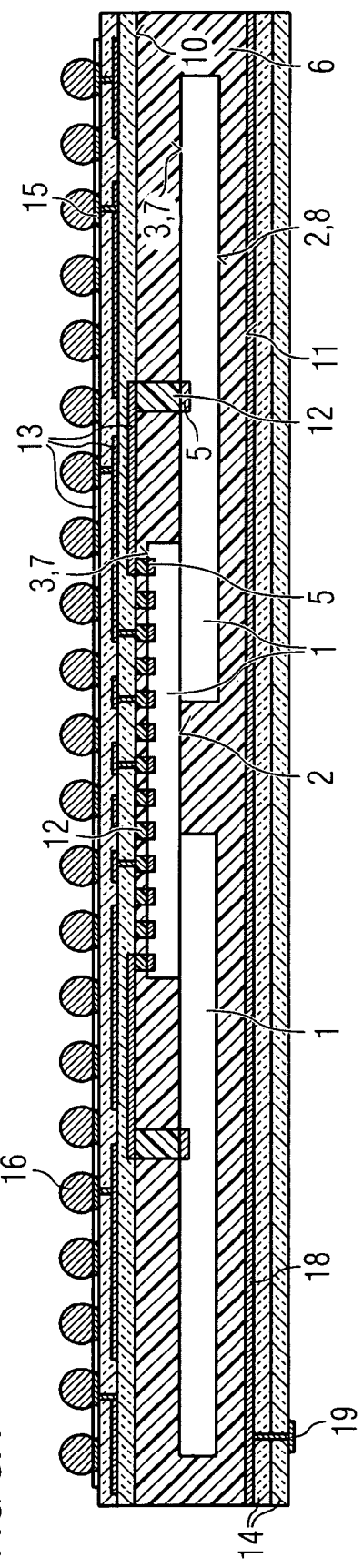

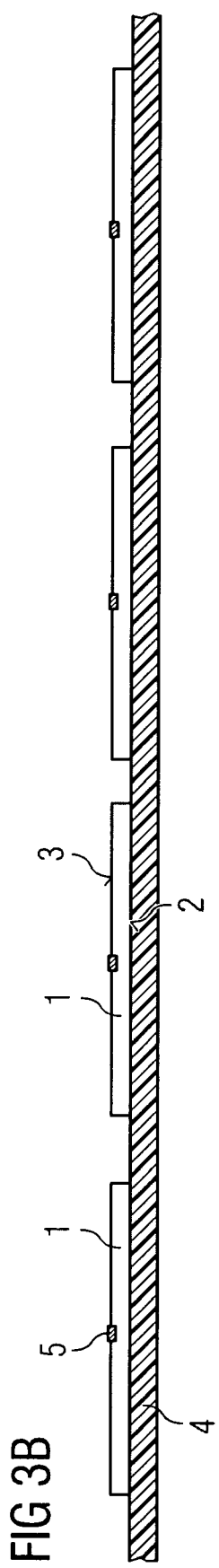
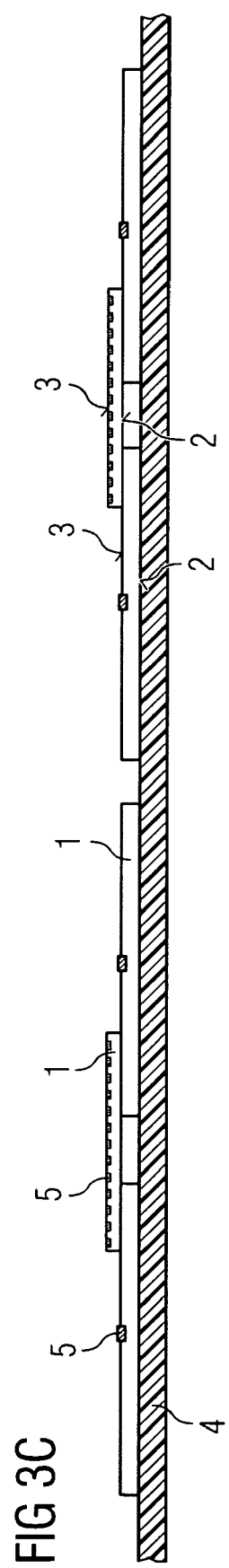
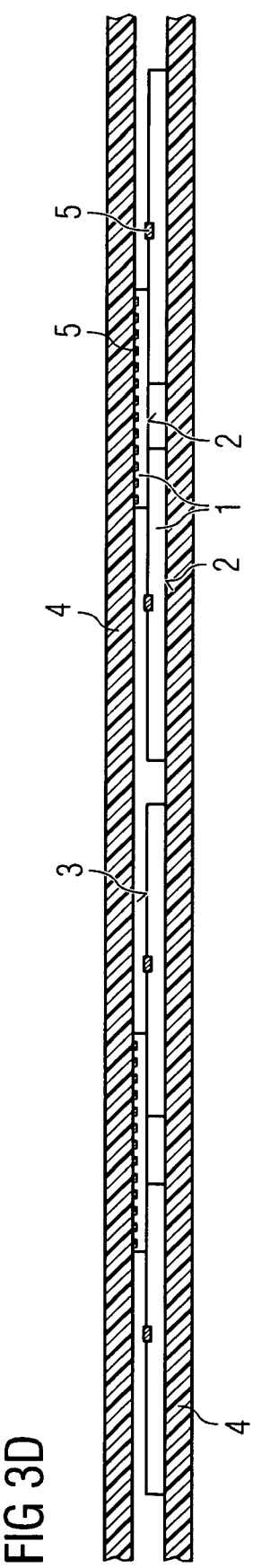

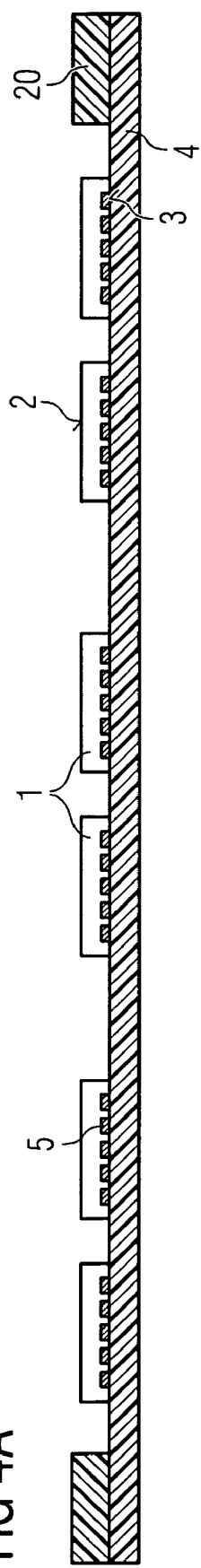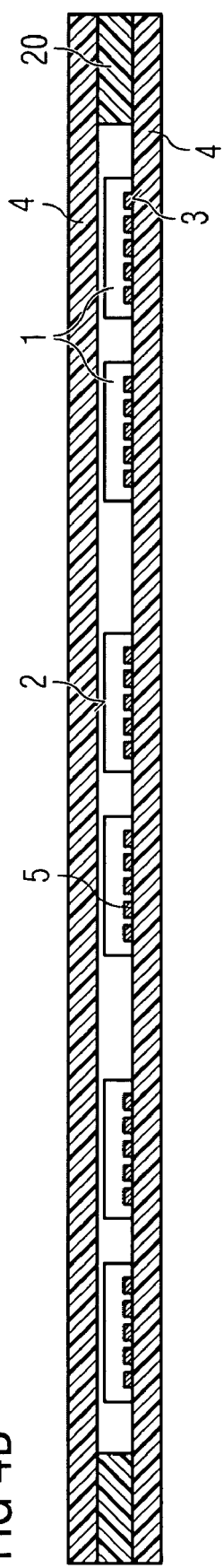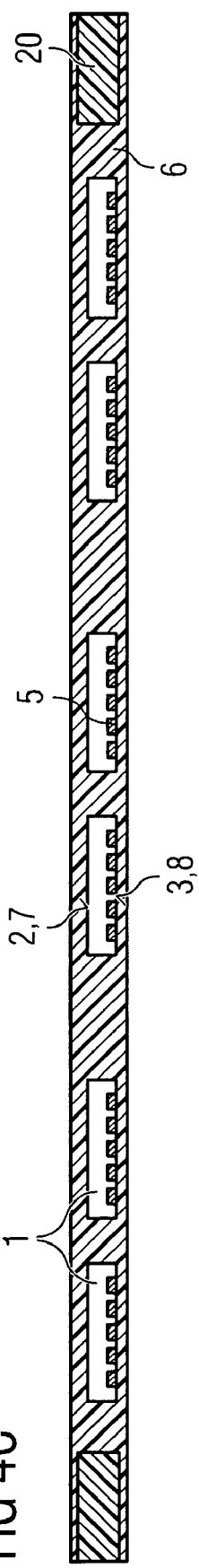

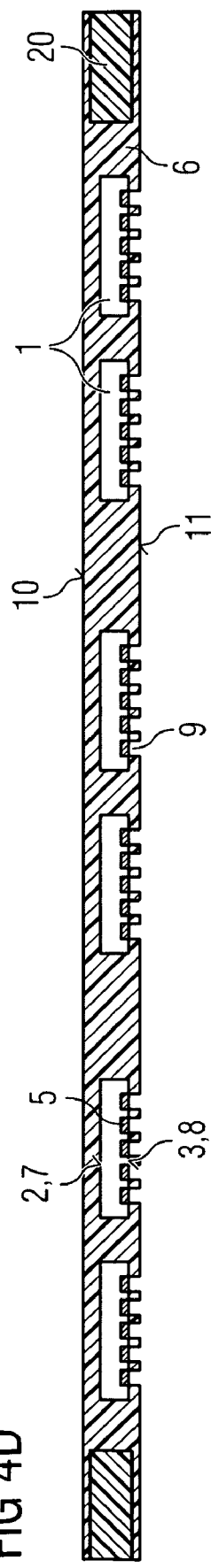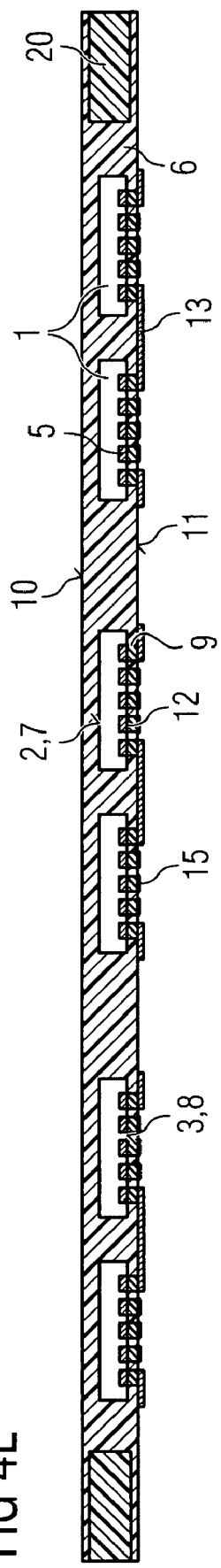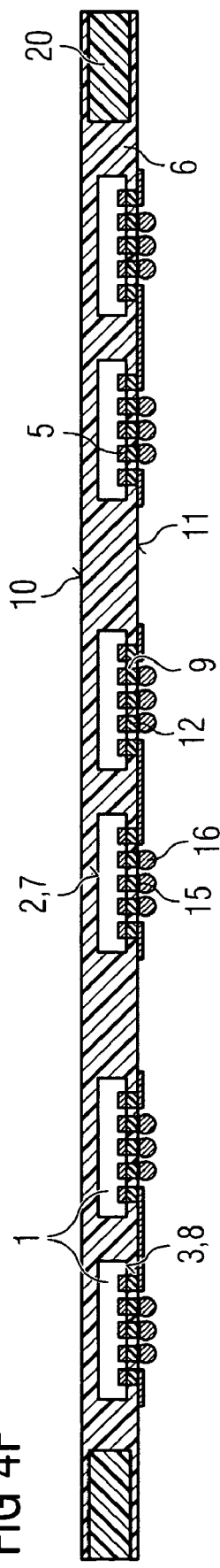

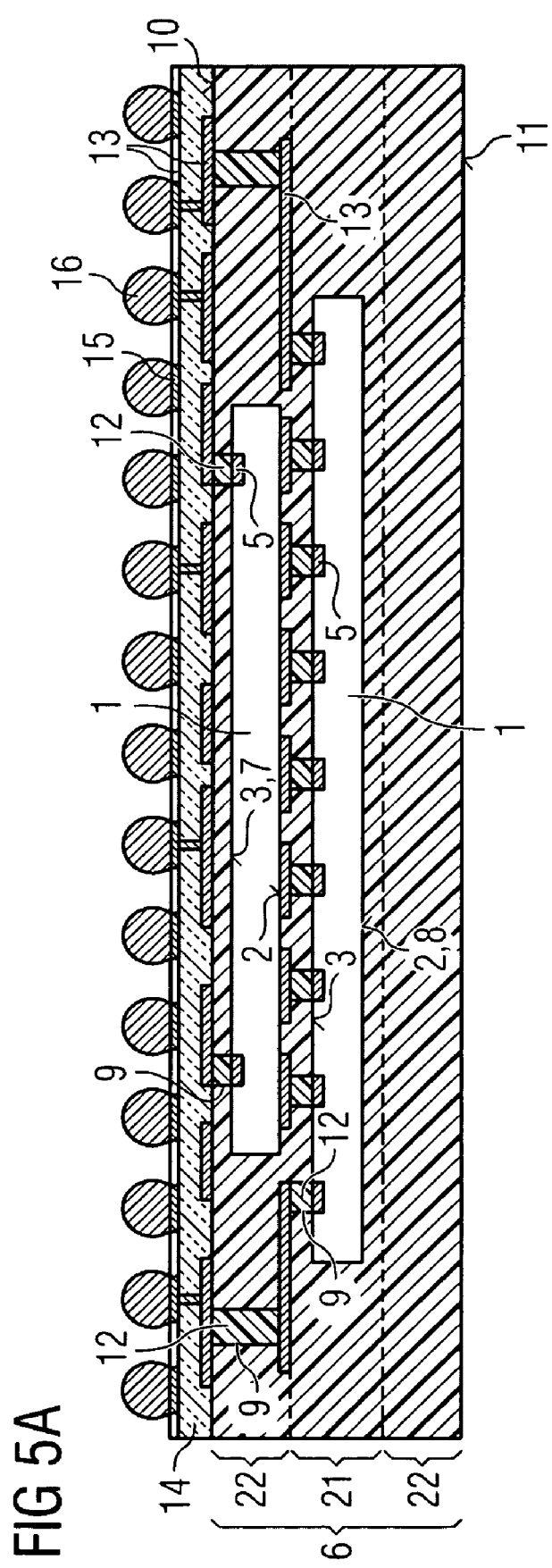

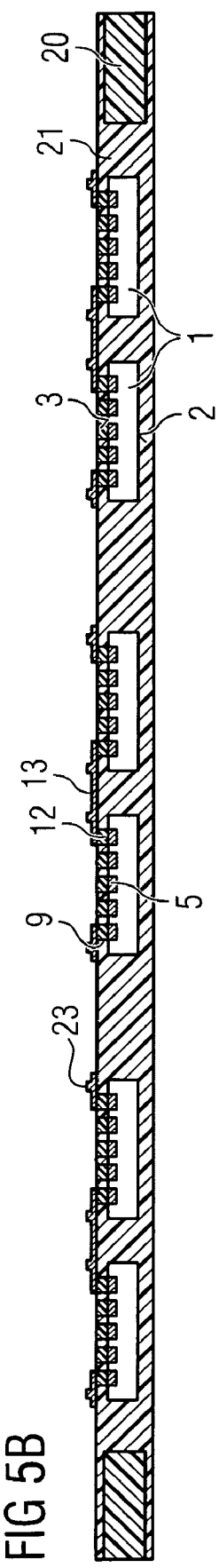
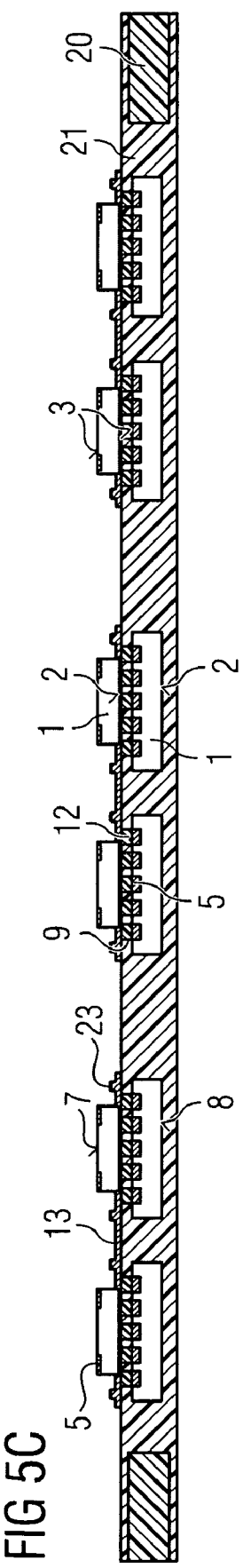
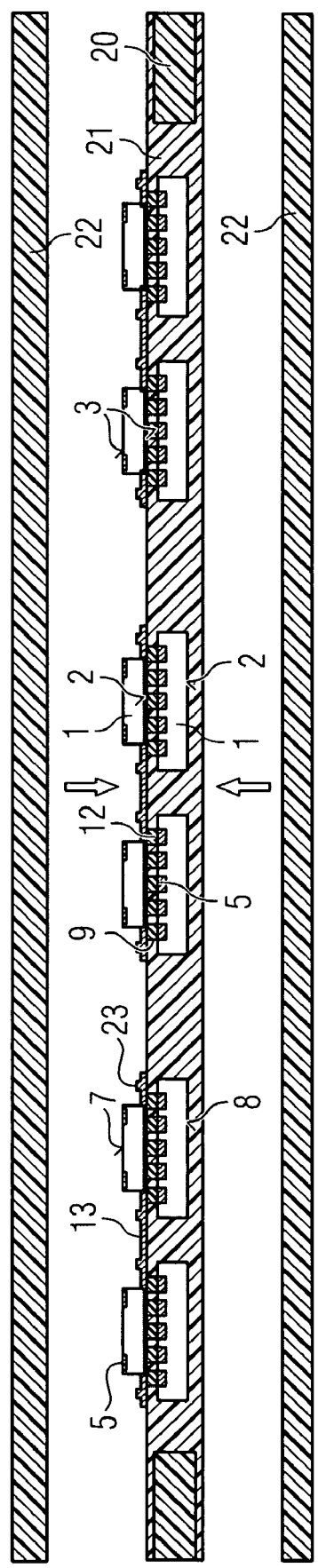

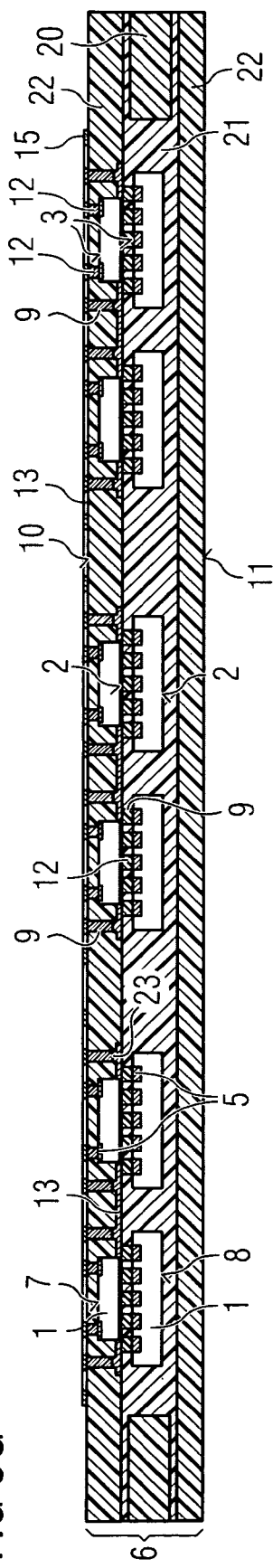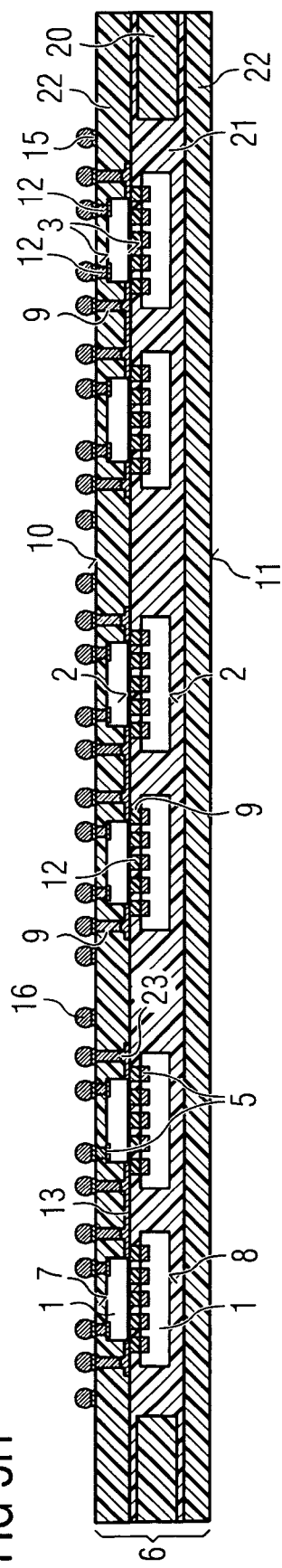

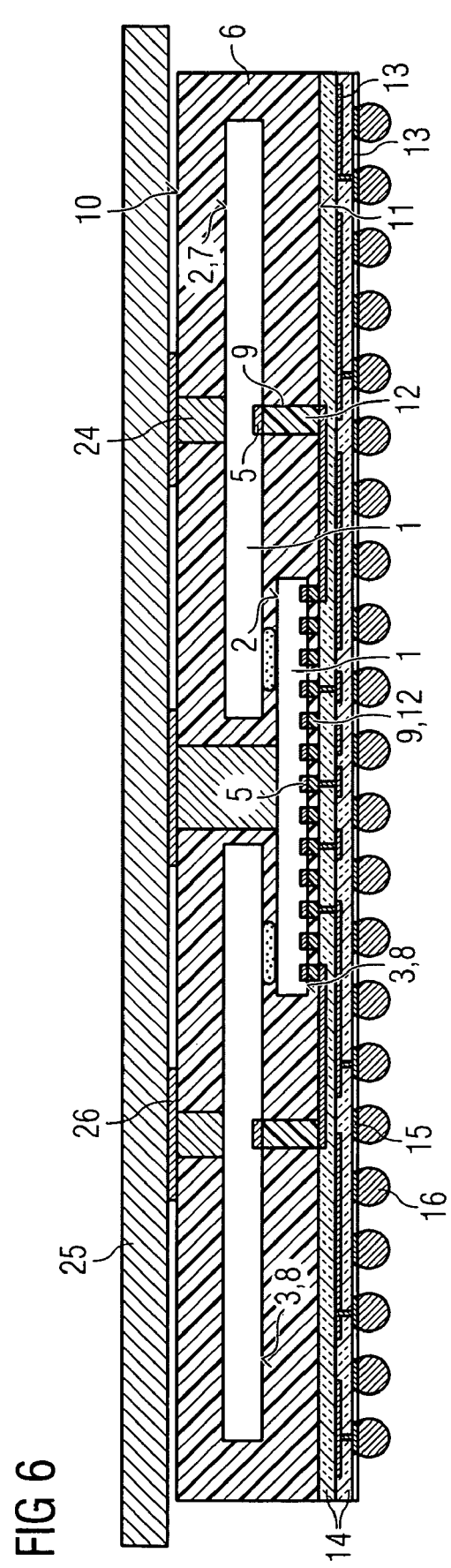

US 7,847,415 B2

METHOD FOR MANUFACTURING A MULTICHIP MODULE ASSEMBLY

TECHNICAL FIELD

The present method relates generally to the field of semiconductor fabrication and, more specifically, to integrated functional systems comprising several components like chips, multichip modules or such.

BACKGROUND

For a high functionality and performance of such systems, multiple semiconductor chips and devices, e.g., processors or memories or both of them, are connected to each other, and to an interconnection unit used for integration in a more complex system. The system is conventionally built by in form of standard modules having separate devices assembled. The several standard modules are mounted onto a printed circuit board (PCB), and electrically connected by multiple connecting elements. The PCB can further comprise components such as passive electronic components or power supply and the interconnection unit. The standard modules themselves in this matter can include one or more components that are electrically connected to each other or are connected to a substrate by means of wiring or through silicon connections. The latter are led through the chip or the substrate.

SUMMARY OF THE INVENTION

A structure of a multichip module assembly is provided as a system in package. The multichip module assembly includes a multiplicity of devices for example processor and memory devices together embedded in a polymer matrix. The chips of the chipset are electrically connected to each other and to interconnect elements on a side of the polymer matrix by through polymer connectors and thin film wiring. The multichip module assembly is a heterogeneous system able to use as an interchangeable module on a next level.

BRIEF DESCRIPTION OF THE DRAWINGS

The present invention will be more completely understood through the following detailed description, which should be read in conjunction with the attached drawings. In this description, like numbers refer to similar elements within various embodiments of the present invention. Within this detailed description, the claimed invention will be explained with respect to preferred embodiments. However, the skilled person will readily appreciate that the methods and systems described herein are merely exemplary, and that variations can be made without departing from the spirit and scope of the invention.

FIG. 1A illustrates a multichip module assembly comprising a two-level chipset with three chips;

FIGS. 1B-1F illustrate steps of a method for manufacturing a multichip module assembly according to FIG. 1A;

FIG. 2 illustrates a multichip module assembly comprising passive electronic components;

FIG. 3A illustrates a multichip module assembly with symmetrical dielectric layer systems;

FIGS. 3B-3I illustrate steps for manufacturing a multichip module assembly according to FIG. 3A in form of a reconstituted wafer;

FIGS. 4A-4F illustrate steps of a method for manufacturing a multichip module assembly comprising a one-level chipset and two polymer sheets fixed to a frame;

FIG. 5A illustrates a multichip module assembly comprising a two-level chipset with an embedded redistribution layer;

FIGS. 5B-5H illustrate steps of a method for manufacturing a multichip module assembly according to FIG. 5A;

FIG. 6 illustrates a multichip module assembly comprising heat pipe channels and a heat spreader;

DETAILED DESCRIPTION OF ILLUSTRATIVE EMBODIMENTS

In FIG. 1A, a multichip module assembly is presented comprising a chipset with for instance, three chips 1. In the embodiment example, those three chips 1 form one chipset that is built on two levels, in the following referred to as chip level. Each chip 1 comprises on its the rear side opposing active side chip contacts 5. The arrangement of the chip contacts 5 is often done in connection with the chip's 1 function. So, processor chips frequently have chip contacts 5 distributed on the chip surface, and the memory chips have chip contacts 5 set up in a row. In the embodiment example, the two lower chips 1 are memory chips with a central row of chip contacts 5, and the one upper chip 1 is a processor chip having chip contacts 5 distributed on a surface.

The two lower chips 1 are arranged relative to each other in a way that the upper chip 1 fits in between the two center rows of chip contacts 5. In that way, all chip contacts 5 of the three chips 1 are accessible without any obstructions. If such an arrangement of the upper chip 1 is not possible due to the distribution of the chip contacts 5 of the lower chips 1, or due to a reduction of the lateral extending of the chipsets, the chip contacts 5 of the lower chips 1 can be redistributed onto the lower chips' 1 active side 3 which is not covered by the upper chip 1 (FIG. 8B).

Figure 7A:
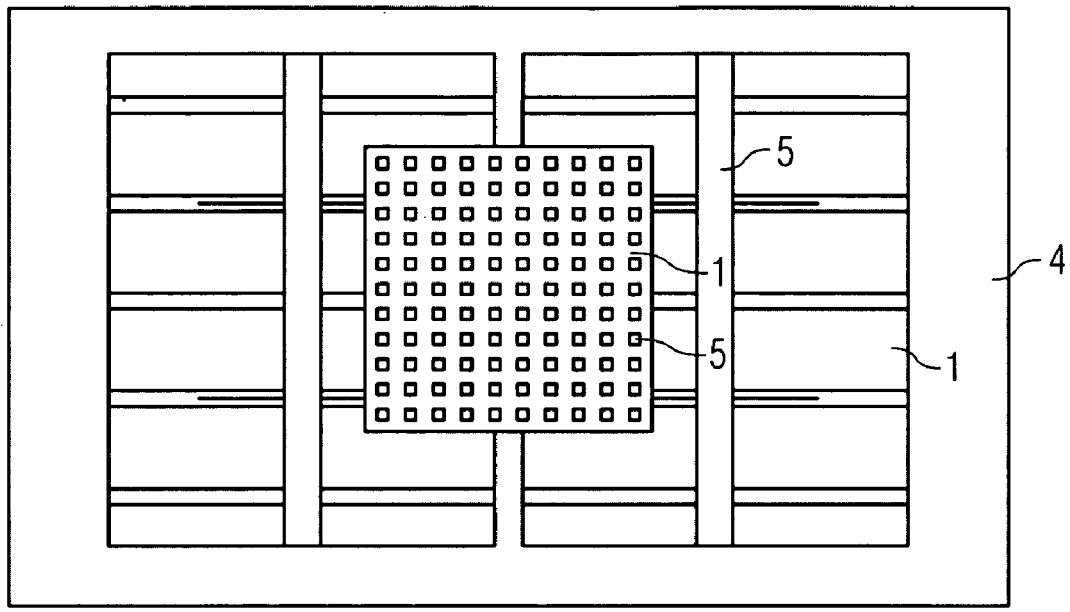
FIGS. 7A and 7B illustrates an embedded chipset of a multichip module assembly with two memory chips and one CPU in a cross section and a top view.
Figure 7B:
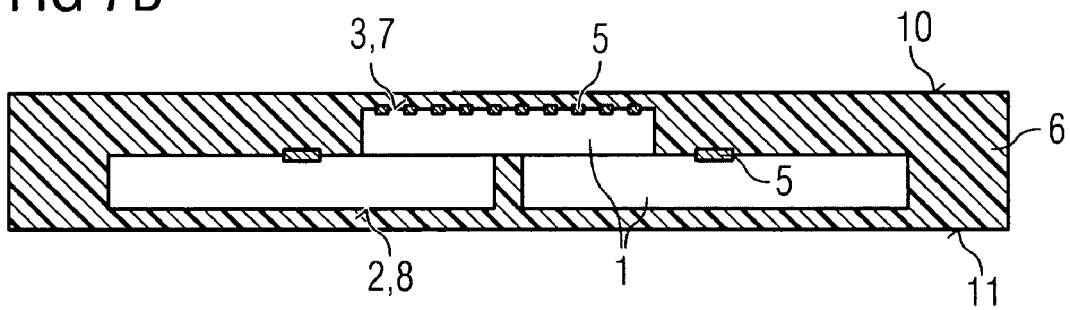
Figure 8A:
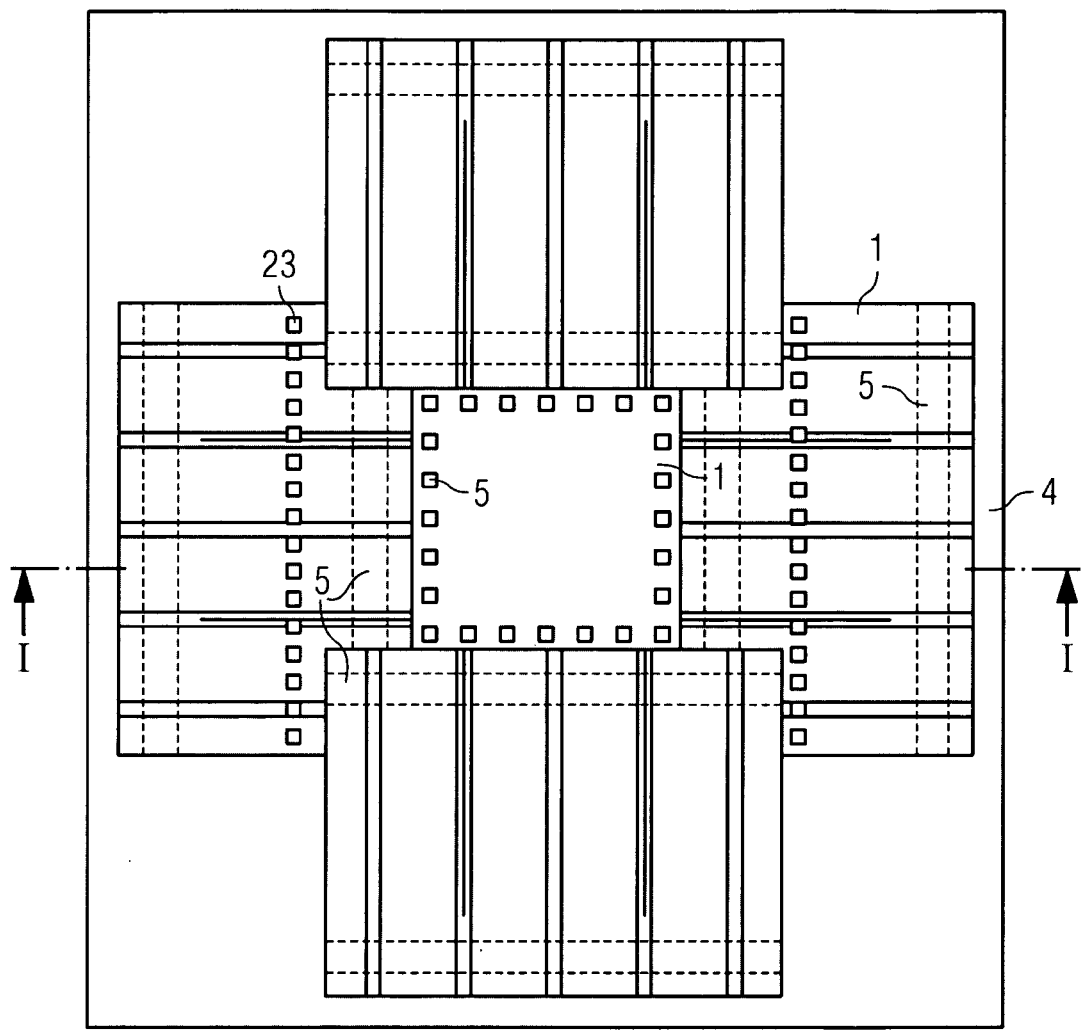
FIGS. 8A and 8B illustrates an embedded chipset of a multichip module assembly with four memory chips and one CPU in a cross section and a top view.
Figure 8B:
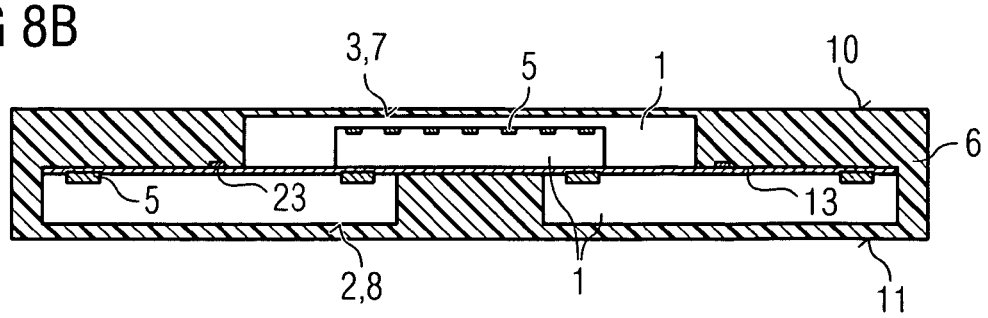

FIGS. 7A and 7B as well as FIGS. 8A and 8B illustrate several basic possibilities to arrange the chips 1 on two chip levels within a multichip module assembly wherein solely the construction of the chipsets and its embedding are presented. The electrical connections are not shown to give a better overview. In FIG. 7A and in the thereto matching cross view FIG. 7B, two memory chips 1 facing up are placed next to each other within a small distance. Both memory chips 1 have a center row of chip contacts 5 in this instance shown as a central band. The distance between the two chips is chosen in a way that another chip 1 can be placed onto the active sides 3 of the two lower chips 1 in between the center rows of the chip contacts 5. The upper chip 1, in this instance the chip of the second chip level, has chip contacts 5 distributed on a surface. Having this arrangement of the chips 1 of the chipsets with the face up mounting of all chips 1, all of the chip contacts are accessible from the top side 10 of the polymer matrix 6 without any obstructions.

In FIG. 8A and in its cross view cut along the cross line I-I (FIG. 8B), an arrangement of the chips 1 is presented wherein at least the chips of the lower or first chip levels have edge rows of chip contacts 5. Those are at least partly covered by the chips 1 of the second chip levels. Therefore to connect the chip contacts 5, they are redistributed by means of film wiring lines 13 into an area that is not covered by the upper chips 1. Because in the present embodiment the arrangement of the chip contacts 5 is not significant for the positioning of the chips 1 relative to each other, the area needed can be minimized that far so that the redistributed contacts 23 (not shown) are freely accessible for electrically connecting.

The arrangements according to FIGS. 1A, 7A and 7B, 8A and 8B as well as arrangements described further below merely present examples. Amendments such as with chips 1 arranged facing down, or other comparable chip levels are possible. The designation of the arrangement of the chip either as facing up or facing down should refer only to the respective illustration to describe it concisely. A reference to the later integration into more complex systems is not intended.

The chip set is symmetrically embedded in a polymer matrix 6. The term "symmetrical" relates to the bottom surface 8 and the top surface 7 of the chip set meaning that both surfaces 7, 8 are covered by the polymer The thickness of the covering does not need to be even. The symmetrical embedding can provide a stress balanced assembly.

The electrical connection of the embedded chips 1 is carried out by means of through polymer connectors 12. Because of the unitary alignment of the chips 1 within the chipset (in FIG. 1A-1F, a face up orientation) each through polymer connector 12 extends from the top side 10 of the polymer matrix 6 to one of the chip contacts 5. The designation of one side of the polymer matrix 6 as "top side" solely relates to the present illustration. It is understood, that an arrangement of the chips 1 in the polymer matrix facing down is also possible. In this case, the through polymer connectors 12 extend from the bottom side 11 of the polymer matrix 6 to the chip contacts 5, where again "bottom side" is referenced solely for the purpose of this figure.

The through polymer connectors 12 are electrically connected by means of film wiring lines 13. Film wiring is, e.g., a metallization using copper or any other materials designed for forming the lines. If necessary, the film wiring lines 13 can be formed as a multilayer structure, wherein each film of wiring lines is electrically isolated from the other by a dielectric layer 14. The electrical connection of each chip 1 by means of through polymer connectors 12 and film wiring lines 13 allows a high density of the connectors and connector lines in comparison to a connection with a conventional substrate. In the embodiment of FIG. 1A, the wiring line structure comprises, for example, three films electrically isolated from each other by two dielectric layers 14. The upper film includes interconnection pads 15 to carry the interconnect elements of the assembly.

Solder balls (FIG. 1A) or connector plugs, wiring or other suitable means are formed on the interconnection pads 15 as interconnect elements 16. The style and design of interconnect elements 16 can as well accord to standards so that they are suitable as an interface for a state of the art plug option or solder ball interconnections or other integration standards. Depending on the requirements for integrating the assembly, all interconnection elements 16 can be distributedly arranged alternatively on the same side 10 or 11 of the polymer matrix 6 (FIG. 1F), or on both sides 10 and 11. In the latter, the orientation and position of the through polymer connectors 12 in the polymer matrix 6, and the position of the film wiring lines 13 on both sides of the polymer matrix 6 are to be adjusted. The distribution of the interconnect elements 16 on both sides 10 and 11 of the polymer matrix 6 can be done in respect to the positions of the individual chips 1, and thus, can as well be done for manufacturing through polymer connectors 12 or respectively to the chip contacts 5 functions.

In a further not shown embodiment, the film wiring lines 13 can be manufactured on either side 10 and 11 of the polymer matrix 6, and can be redistributed on just one side 10 or 11 by means of other through polymer connectors 12 extending through the entire polymer matrix 6. Also in this instance, the interconnection elements 16 are to be arranged only on one side 10 or 11.

Irrespective of whether film wiring lines 13 are formed on one or both side 10, 11, the dielectric layer on both sides 10, 11 of the polymer matrix 6 is formed at least symmetrically in one embodiment of the procedure (FIG. 3A). Therefore, the above described symmetry of the polymer matrix 6 for producing a stress balanced assembly in further components of the assembly is continued. The layers of the film wiring lines 13 only play a minor role for the symmetry of the assembly because of its thinness and structuring. However, these layers can be symmetrically arranged on both sides of the polymer matrix due to, e.g., the procedure.

In another embodiment, passive electronic components 17 are integrated into the chipset as well. Comparably to the above described attaching and electrically connecting of the chips 1 and respectively to the space provided inside the chipset, those components are added and embedded in the polymer matrix 6, and by means of through polymer connectors 12 and film wiring lines 13 electrically connected (FIG. 2). Alternatively, a single or more passive electronic components can also be attached through thin film technology.

A closed system approach comprising all essential components of an integrated functional system without interconnect elements between its parts is provided with the described multichip module. Only system-out interconnects can be formed for any modules. Due to reduced interconnects and wiring, the assembly shows a higher performance and lower energy consumption. Further, this higher performance is sustained by a reduction of the lateral expansion and the height of the assembly. This is possible because of the stress balance of the assembly, and because of the procedure of placing/positioning the individual chips 1 and their embedding which in turn allows the use of thin chips. Different functional systems like DRAM/GPU or DRAM/CPU or DRAM/ASIC or DRAM/FPGA or comparable ones can be created with the provided method.

For manufacturing such a multichip module assembly as in FIG. 1B, two chips 1 are attached on a polymer sheet 4 by use of pick-and-place, so that the rear sides 2 face down towards the polymer sheet 4, i.e., face up. Another chip 1 is mounted onto the first two chips 1 facing up. It is understood that the chipset can comprise more or less than three chips 1, which are arranged in one (FIG. 4F) or more than two chip levels. To give a better overview, in the following embodiments only two chip levels shall be described. The construction of any further level can be done in a simple way through repeating the construction of the second level.

Returning to FIG. 1B, the placing of the lower chips 1 on the polymer sheet 3 relative to each other can be done in different ways and can be secured for the subsequent procedure. If no shifting of the lower chips 1 relative to each other has happened until the embedding of the chipset a simple placing is sufficient. Otherwise, the chips 1 can be fixed onto the polymer sheet 4, e.g., through gluing onto a sticky polymer sheet 4, with glue dots on the rear side 2 of the chips 1, or by means of any other suitable way. Also, the attaching of the upper chip 1 to the bottom chips 1 is done alternatively by simply placing it relative to the bottom chips 1, or through placing and gluing. An alignment of all chips 1 of the chipset to each other is required to minimize the risk, that during the following polymer embedding the chips change its relative position and a following lithography step will not meet the chip contacts 5 for via opening.

In a following step, the chipset is embedded by the polymer of the sheet (FIG. 1C) by heating up the polymer sheet 4 to the melting point. The polymer turns into liquid, fills all spaces in the chipset, and completely embeds the chipset. To ensure the symmetrical embedding of the chipset, the amount of the polymer is respectively provided by means of the thickness and size of the polymer sheet 4. The size of the polymer sheet 4 can be determined by, e.g., the size of the chipset. The thickness of the polymer sheet 4 can be mostly adjusted in any way. So, polymer foil with varying thicknesses having only very small gradations are offered on the market. For embedding the chipset, various known procedures can be used. For using a polymer sheet 4, a lamination through a vacuum is suitable allowing a faultless and blister-free embedding as an example. For this purpose, the polymer sheet 4 with the chips 1 placed on it in a vacuum is exposed to a temperature above the melting temperature of the polymer, and a defined pressure force. After embedding the chipsets using the liquidized polymer, the latter is cured at higher temperature and cooled down at room temperature.

Subsequent to the curing and cooling of the polymer, the chipset is symmetrically embedded by the polymer matrix 6. An unwanted or undefined movement or turning of the chips 1 is to be avoided during the embedding. Furthermore, warpage of the chipset or of a reconstituted wafer of a plurality of chipsets can be prevented because of a difference between the CTE of polymer and chips. In this way, the for the following steps necessary relative position of the chips 1 in the chipset and in the polymer matrix is possible.

Alternatively, the chipset can be constructed on a temporary base, wherein the component of the assembly remains or is removed later on. In this case, the embedding of the chipset is done by applying the sufficient amount of polymer to the base and curing the polymer. For forming a symmetrical encapsulation of polymer, the chipset can in one embodiment in which the temporary base is removed later be arranged on the base by means of spacers. The spacers are dimensioned in that way so that the liquidized polymer can flow underneath the chipset and symmetrically embed the same. As described above, the amount of polymer applied on the dimensions of the chipsets, in possible gaps, and the complete and symmetrical embedding is to be adjusted.

In FIG. 1D, the embedded chip contacts 5 of all chips of the chipset are laid open by forming open vias 9 into the polymer matrix 6 above each chip contact 5. The open vias 9 can be formed into the polymer matrix via various suitable methods. Suitable methods are, e.g., various etching processes by using a mask (not shown). By means of the mask, the position of the chip contacts 5 of the chipset is copied onto the top side 10 of the polymer matrix 6 using lithographic means. In an alternative embodiment, the open vias 9 are generated by means of a laser through which open vias 9 can be formed with different diameters.

Suitable measurements of the diameters of the open vias 9 can be in a range of 50-100 μm. The formed open via 9 using a laser can have tapered side walls facing towards chip contacts 5 which allow an easier formation of the wiring later on. The positions of the open vias 9 above the chip contacts 5 can be determined by, e.g., an adjusting mark (not shown) or by using a transparent polymer so that the embedded chip contacts 5 remain visible.

In a following step, the open vias 9 are filled with an electrical conductive material (FIG. 1E). So, through polymer connectors 12 are formed extending from a chip contact 5 to the surface of the polymer matrix. The filling of the open vias 9 is possible by using, e.g., stencil printing or other suitable methods.

In a further step, film wiring lines 13 are formed into the surface of the polymer matrix 6 on which the through polymer connectors 12 end (FIG. 1F). For forming film wiring lines 13 with one or more layers, connector lines are deposited onto the polymer matrix by a suitable and known physical or chemical thin-film deposition method, and are if needed edited or structured and connected with each other. The upper layer of the film wiring lines 13 comprises as well the interconnection pads 15 described further above on which the interconnection elements 16 are formed in a further step.

In FIG. 3A, another embodiment of the multichip module assembly is illustrated whose construction in its essentials is very similar to the one in FIG. 1A. As long as the assembly according to FIG. 3A is consistent with the one according to FIG. 1A, it is referred to the above descriptions. Both assemblies differ in the alignment of further dielectric layers 14 on the bottom side 11 of the polymer matrix 6. To improve the stress balance of the multichip module assembly, those additional dielectric layers 14 are formed as anti-stress layers. In a further embodiment at least one of the amount, the thickness and the material of the further dielectric layers on the bottom side are adapted to the dielectric layer 14 on the top side 10 and to a possible stress unbalance of the embedded chipsets. If film wiring lines 13 are formed on the bottom side 11 of the polymer matrix 6 in an embodiment, a structure of dielectric layers 14 can be symmetrically arranged as anti-stress layers.

In a further embodiment, an electromagnetic shield layer 18 for shielding an electronic component is incorporated in the multichip module assembly. In FIG. 3A the electromagnetic shield layer 18 is a metallic layer arranged on the bottom side 11 of the polymer matrix 6 and covered by the dielectric layers 14. A contact of the shield layer 19 to connect a certain voltage, e.g., ground, is arranged on the bottom of the dielectric layers 14. Alternatively, an electromagnetic shield layer 18 can be arranged between two dielectric layers 14 over the bottom side 11 or over the top side 10 of the polymer matrix 6. If necessary, an electrical contact of an electronic component of the assembly can be extend through the electromagnetic shield layer 18 without any electrical connection with the electromagnetic shield layer 18.

It is understood that passive electronic components (not shown) as described above can be integrated into the multichip module assembly according to FIG. 3A and as well into further below described embodiments.

Figure 3E:
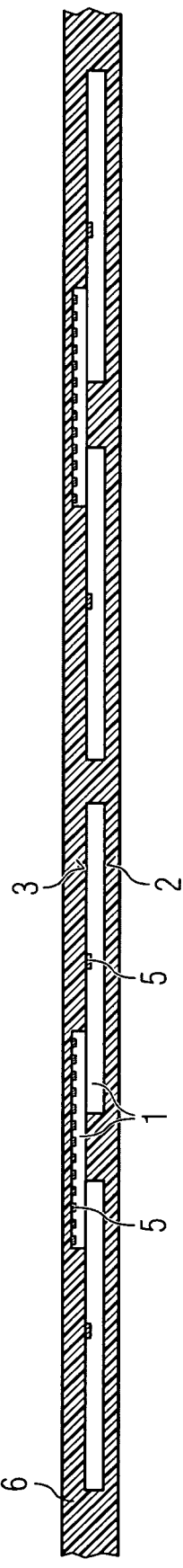
Figure 3F:
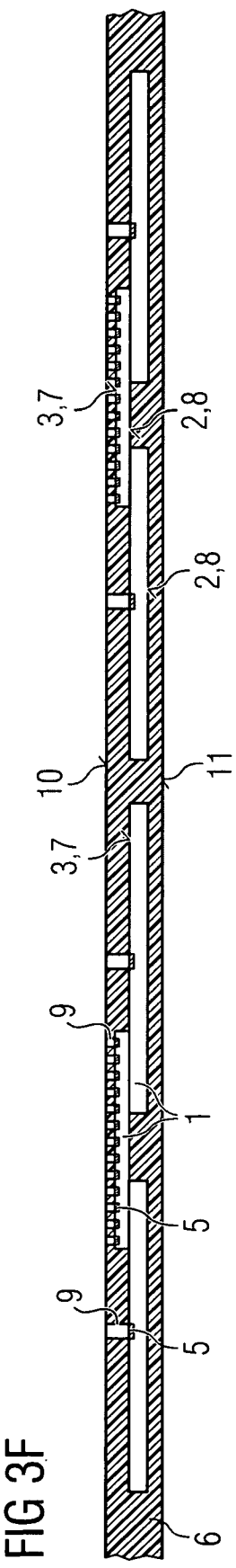

In FIGS. 3B-3I, the basic steps of another embodiment of the procedure to manufacture a multichip assembly are shown at the example of the assembly according to FIG. 3A. The embodiment of the procedure is basically identified by consolidating a group of chipsets to a so called reconstituted wafer to embed and electrically connect several multichip module assemblies on wafer level. To build the reconstituted wafers, several chipsets are constructed next to each other and are in their position to each other symmetrically embedded into a polymer matrix 6 as described above in reference to FIG. 1A (FIGS. 3B-3E). Also, the embedding of a plurality of adjacently arranged chipsets is done equivalent to a single chipset as described above. In this way, a reconstituted wafer is producible having the common the circular form like the silicon wafer. This wafer allows the use of the apparatuses and procedures to handle silicon-wafer. However, any other form of the reconstituted wafers can be manufactured as well. For instance, rectangular and square wafers are more efficient to produce in respect of the material and space needed.

Figure 3G:
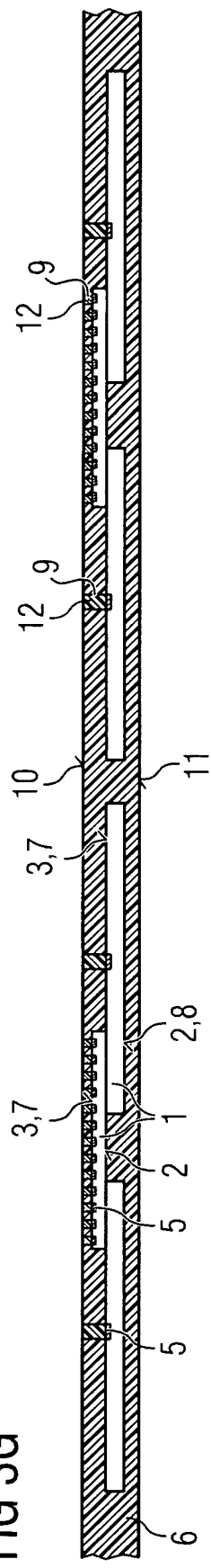

In a step following the embedding, through polymer connector 12 are produced for all chip contacts 5 as described above for a single multichip module assembly by forming open vias 9 into the polymer matrix 6 (FIG. 3F) and filling the latter with conductive material (FIG. 3G). As long as passive electronic components 17 are integrated in an embodiment, their electric contacts are also electrically connected by through polymer connectors 12. The orientation of the through polymer connectors 12 towards one or both sides 10, 11 of the polymer matrix 6 depends again on the orientation of the chips 1 either facing up or facing down, and on the requirements of integrating the multichip module assembly. In the presented embodiment, all through polymer connectors 12 extend to the top side 10 of the polymer matrix 6.

Figure 3H:
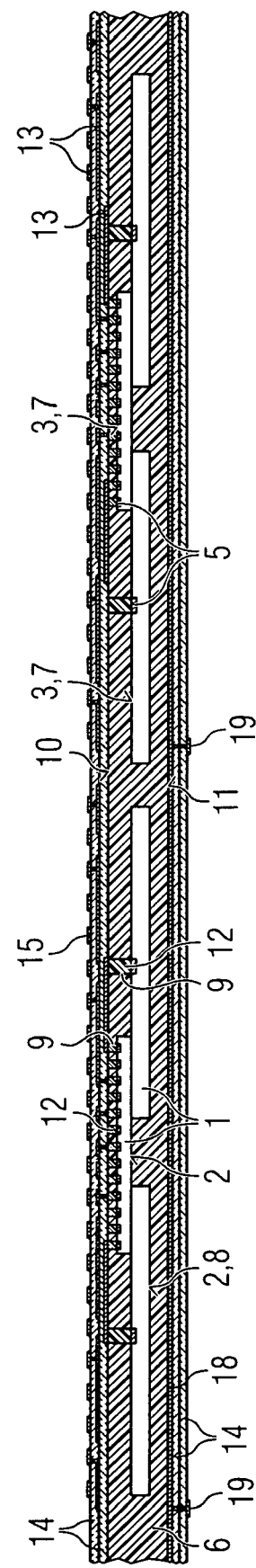
Figure 3I:
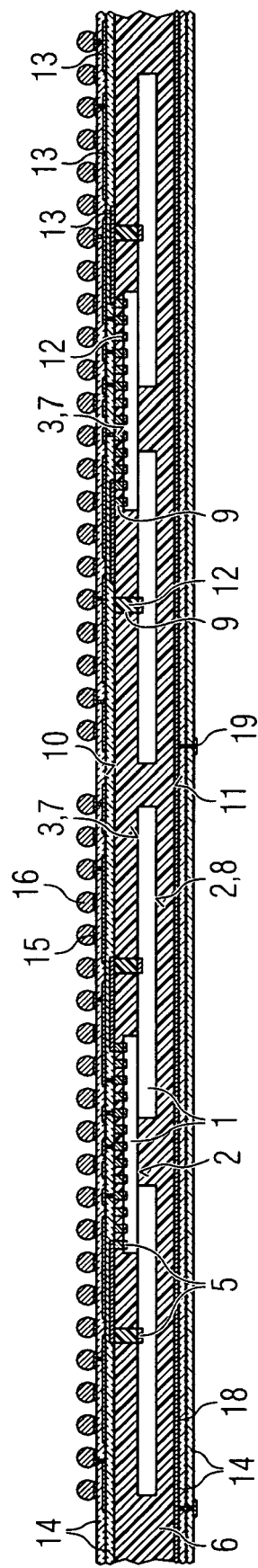

Subsequently, film wiring lines 13 are formed on the top side 10 of the polymer matrix 6 as a multi layer structure by means of a thin film technology so that necessary interconnections between the components of a multichip module assembly as well as between the components and the interconnection pads 15 are produced. A dielectric layer 14 is arranged in between each individual layer of the film wiring lines 13 to electrically insulate the same (FIG. 3H). Interconnection pads 15 are components of the top layer of the film wiring lines 13, and are formed all together with the latter. Interconnection elements 16 are formed onto the interconnection pads 15, as solder balls in the presented embodiment (FIG. 3I). On the bottom side 11 of the polymer matrix 6 the electromagnetic shield layer 18 is formed and covered by two dielectric layers 14. Those layers can be formed together with the dielectric layers 14 of the top side 10 and alternatively independently in separate steps. In the subsequent dicing, the multichip module assemblies are singularized. Additional steps to finish the multichip module assemblies, or as well procedural steps in between the above described can be included for reasons of the procedure itself or because of handling special materials.

With the method according to FIGS. 4A-4F, multichip module assemblies with only one chip level are produced. This method differs from the method described before using a reconstituted wafer by the employment of a frame 20. A polymer sheet 4 such as a sticky polymer foil is fixed to the frame 20. The chips of one chip level of a separate chipset, or of one chip level of the chipsets of a reconstituted wafer (FIG. 4A) are placed on this polymer sheet 4 and within the frame 20. If in one embodiment the frame 20 has a lower CTE (Coefficient of Thermal Expansion) than the polymer sheet 4, a shrinking of the polymer sheet 4 during the curing of the polymer is prevented. Therefore, the shift of the chips 1 from their relative position is prevented.

In a subsequent step, a second polymer sheet 4 is fixed to the frame 20 so that the chips 1 are covered by both polymer sheets 4 (FIG. 4B). The chips 1 are laminated with both polymer sheets 4 under heat, vacuum and pressure force. As a result of the lamination, the chips 1 of one or more chipsets are symmetrically embedded in a polymer matrix 6 (FIG. 4C). The polymer matrix 6 on the frame 20 behaves like a drum skin. For contacting the chips 1, their chip contacts 5 are laid open by, e.g., a laser via generation (FIG. 4D), and the open vias 9 are filled with a conductive material. Eventually, the film wiring lines 13 are formed as interconnections between the chips (FIG. 4E). In the embodiment according to FIGS. 4A-4F, the chipsets are formed as one-level chipsets. That's why it is possible to attach at least some interconnection elements 16 directly to the through polymer connectors 12 (FIG. 4F). If the latter is not possible because of, e.g., the density of the through polymer connectors 12, complementary, a redistribution can be done by means of film wiring lines 13 and interconnection pads 15. In the subsequent dicing of the multichip module assemblies, the frame 20 is removed. For the methods which are applicable to the above mentioned steps, and for the alternative embodiments, it is referred again to description further above.

In FIG. 5A, another embodiment of the multichip module assembly is presented in which the chip contacts 5 of the chips 1 of the first chip level are distributed on a surface on their active side 3. Therefore, the chip contacts 5 of the first chip level are at least partly covered by the chips 1 of the second chip level. For contacting those covered chip contacts 5, a redistribution is arranged by means of film wiring lines 13 on the polymer layer embedding the first chip level embedded and which in the following is identified as the first polymer layer 21. Those lines redistributed the chip contacts 5 on the surface of the first polymer layer 21 so that they are uncovered redistributed contacts 23. With this, the chip contacts 5 of the first chip level can be electrically contacted/connected by means of film wiring lines 13 and through polymer connectors 12 as described above for FIG. 1A. For a further description of the multichip module assembly according to FIG. 5A, it is referred to the description for FIG. 1A.

As long as in another embodiment the chips of both chip levels rear sides 2 are arranged towards the rear side 2, the chip contacts 5 of both chip levels can be electrically connected directly, i.e., without any redistribution on the first polymer layer 21, via the through polymer contacts 12 in the upper and bottom polymer layer 22 to the film wiring lines 13 on the topside 10 and on the bottom side 11 of the polymer matrix 6. In this case, the interconnect pads 15 and interconnect elements 16 can be arranged on both sides of the polymer matrix 6. Alternatively in this as well as in the embodiment described before, a redistribution of the interconnect pads 15 can be done on either the side 10 or 11 of the polymer matrix 6 through additional through polymer connectors 12 extending through all three polymer layers 21, 22.

Figure 5E:
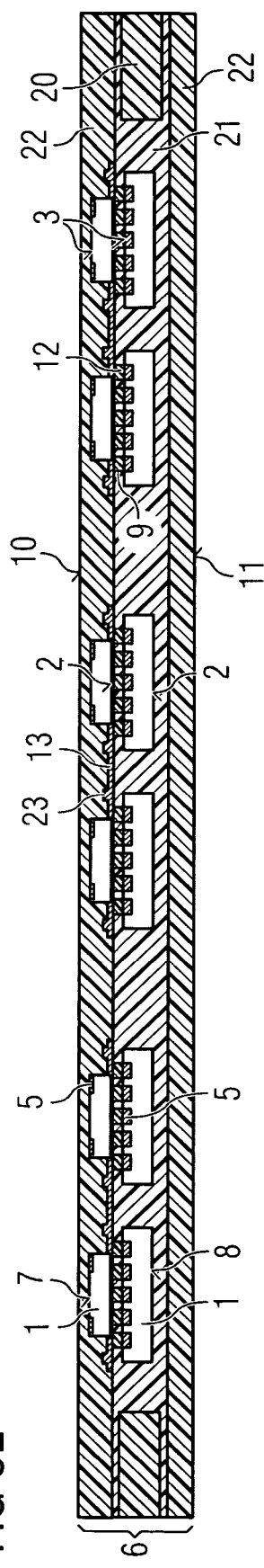

This method to produce this assembly shown in FIGS. 4A-4D and complementary in FIGS. 5B-5G illustrate an embodiment of the method according to FIGS. 4A-4F. For manufacturing the second chip level, the chips 1 of the second chip level are added to the embedded first chip level after the embedding and the electrically connecting of the chips 1 of the first chip level. For manufacturing the first chip level (FIG. 5B), it is referred to descriptions above for FIGS. 4A-4E. In contrast to FIG. 4E, the film wiring lines 13 in FIG. 5B are formed in a way that those serve the interconnecting between the chips 1 of the first chip level as well rewiring of their chip contacts 5 distributed on a surface.

After the redistribution, the chips 1 of the second chip levels are bonded on the top side 10 of the first polymer layer 21 and via the chips 1 of the first chip levels (FIG. 5C). In an embodiment of the method, the chips 1 of the second chip levels can be bonded alternatively to the first polymer layer 21 so that the rear sides 2 of the chips 1 of both chip levels are opposite to each other. In this case, the chips 1 of the second chip levels do not cover the chip contacts 5 of the chips of the first chip level and thus, may not require a redistribution.

Subsequently, a further polymer sheet 4 is fixed to the frame 20 that surrounds the first chip level so that the second chip levels are covered. Another polymer sheet 4 is fixed to the frame 20 onto the bottom side 11 of the first polymer layer 21, so that it is symmetrically arranged to the polymer sheet 4 on the top side 10 (FIG. 5D). The polymer of both upper and bottom polymer sheet 4 turns liquid under heat, vacuum and pressure force, and embeds the first polymer layer 21 including the frame 20, the redistribution and the second chip level (FIG. 5C). In this way, the polymer matrix 6 of the multichip module assembly consists of three polymer layers, a middle one 21, an upper one 22 and a bottom one 22.

Figure 5F:
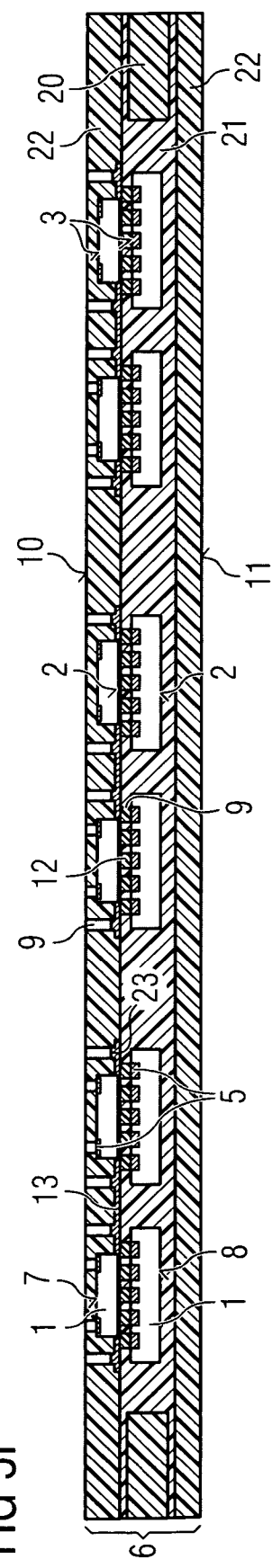

The chip contacts 5 of the second chip level and the redistribution contacts 23 are laid open by means of the successive via opening generation (FIG. 5F). Contact surfaces which are formed into the layer of film wiring lines 13 and which represent redistributed chip contacts 5 by means of film wiring lines 13 shall be identified as redistribution contacts 23. Through filling the open vias 9 with electrically conductive material, and through forming film wiring lines 13 on the surface of this polymer layer in which the through polymer connectors 12 end, the components of a multichip module assembly are interconnected, and electrical connections are formed between the components and the interconnected pads 15 (FIG. 5G). Latter are formed into the top layer of film wiring lines 13 of the assembly. As in embodiments above already several times described, the interconnect elements 16 in the end are formed on the interconnect pads 15 (FIG. 5H).

In another embodiment, the through polymer connector technology is used for the dissipation of heat which is produced inside the chips or in other components of the multichip module assembly. For this purpose, one or more heat pipe channels 24 are formed into the polymer matrix 6 over which the heat from chip 1 is diverted to a suitable heat spreader 16 outside the assembly. For this purpose then, the heat pipe channels 24 extend from the surface of the polymer matrix 6 to one mostly the rear side 2 of a to be cooled chip 1. The heat pipe channels 24 are filled with a thermal conductive material such as a solder paste or a polymer and are in thermal contact with a heat spreader 25 (FIG. 6). For creating a good thermal contact to one of the head spreader 25, a thermal contact pad 26 can be arranged between the filling of the heat pipe channel 24 and the heat spreader 25 wherein the heat spreader 25 touches the pad with an in comparison to the diameter of the heat pip channel 24 enhanced area. Generally, a heat spreader 25 shall be understood to mean a heat sink which can consist of a metal structure with one or more flat surfaces, or as any other suitable component to actively or passively cool a chip 1.

What is claimed is:

1. A multichip module assembly, comprising:
   a chipset comprising at least a first chip and a second chip wherein, said the first and second chips have active sides, rear sides opposite the active sides, and chip contacts on their active sides;
   a polymer matrix, wherein the chips are embedded in the polymer matrix in a symmetrical manner relative to the top and the bottom surface of the chipset;
   through polymer connectors extending from a surface of the polymer matrix to a contact situated inside the polymer matrix for electrically connecting the contact;
   an interconnect element arranged on a side of the polymer matrix for electrical contact to an external device, and
   a film wiring line arranged on a side of the polymer matrix, wherein the film wiring line electrically connects two through polymer connectors of two chips, or a through polymer connector to an interconnect element.

2. The multichip module assembly according to claim 1, further comprising one or more dielectric layers arranged on sides of the polymer matrix.

3. The multichip module assembly according to claim 2, wherein the dielectric layers are arranged as a multilayer structure comprising an electromagnetic shield layer.

4. The multichip module assembly according to claim 1, wherein the first and second chips are attached to each other.

5. The multichip module assembly according to claim 1, wherein the chipset is laminated in the polymer matrix.

6. The multichip module assembly according claim 1, wherein the polymer matrix includes at least two polymer layers.

7. The multichip module assembly according to claim 1, wherein the chips are arranged close to each other in more than one chip level.

8. The multichip module assembly according to claim 1, further comprising:
   a further film wiring line embedded in the polymer matrix; and
   a redistribution contact electrically connected with a chip contact by the film wiring line.

9. The multichip module assembly according to claim 1, wherein the chipset includes a memory chip and a processor chip.

10. The multichip module assembly according to claim 1, further comprising a passive electronic component arranged adjacent the first chip and electrically connected to a wiring line by a through polymer connector.

11. The multichip module assembly according to claim 1, further comprising a heat pipe channel formed in the polymer matrix and extending from a chip to a surface of the polymer matrix.

12. A multichip module assembly, comprising:
   a chipset comprising at least a first chip and a second chip wherein the first and second chips have active sides, rear sides opposite the active sides, and chip contacts on their active sides, wherein the first and second chips are arranged in at least two chip levels;
   a polymer layer;
   a further polymer layer, wherein one part of the chipset is embedded in a first polymer layer, and a further part of the chipset is embedded in a further polymer layer, wherein the polymer layer and the further polymer layer are attached to each other in a vertical manner forming a polymer matrix, and wherein the polymer matrix embeds the chipset in a symmetrical manner relating to top and bottom surfaces of the chipset;
   through polymer connectors extending into the first polymer layer from a surface of the first polymer layer further to a contact situated inside the polymer layer for electrically connecting the contact;
   a first wiring line arranged on a side of the first polymer layer and comprising redistribution contacts, wherein the film wiring line electrically connects a chip contact of the first chip level with a redistribution contact;
   further through polymer connectors extending into the further polymer layer from a surface of the polymer matrix further to a contact or to a redistribution contact situated inside the polymer matrix for electrically connecting the contact;
   an interconnect element arranged on a side of the polymer matrix for electrical contact to an external device; and
   a further film wiring line on a side of the polymer matrix, wherein the film wiring line electrically connects two through polymer connectors of two chips, or a through polymer connector to an interconnect element.

13. The multichip module assembly according to claim 12, further comprising one or more dielectric layers arranged on sides of the polymer matrix.

14. The multichip module assembly according to claim 13, wherein the dielectric layers are arranged as a multi layer structure comprising an electromagnetic shield layer.

15. The multichip module assembly according to claim 12, wherein the chipset includes a memory chip and a processor chip.

16. The multichip module assembly according to claim 12, further comprising a passive electronic component arranged adjacent the first chip and electrically connected to a film wiring line by a through polymer connector.

17. The multichip module assembly according to claim 12, further comprising a heat pipe channel formed into the polymer matrix and extending from a surface of the polymer matrix to a chip.

18. A wafer reconstituted from a plurality of multichip module assemblies, the reconstituted wafer comprising:
- a plurality of chipsets arranged side by side and embedded in a common polymer matrix in a symmetrical manner relating to top and bottom surfaces of the chipsets, each chipset comprising at least a first chip and a second chip arranged adjacent each other, and wherein each chip in the chipset includes an active side, a rear side opposite the active side and chip contacts on their active side;
- through polymer connectors extending from a surface of the polymer matrix to a contact situated inside the polymer matrix for electrically connecting the contact;
- an interconnect element arranged on a side of the polymer matrix, and
- a film wiring line arranged on a side of the polymer matrix, wherein the film wiring line electrically connects two through polymer connectors of two chips, or a through polymer connector to an interconnect element.

19. The reconstituted wafer according to claim 18, further comprising a frame attached adjacent to an edge of the wafer.

20. The reconstituted wafer according to claim 19, wherein the frame has a lower CTE than the polymer matrix.

21. The reconstituted wafer according to claim 18, wherein the first and second chips are attached to each other in more than one chip level.

22. The reconstituted wafer according to claim 18, wherein the polymer matrix includes at least two polymer layers.

23. The reconstituted wafer according to claim 18, wherein the chips of the chipsets are arranged in more than one chip level.

24. The reconstituted wafer according to claim 18, further comprising:
- a film wiring line embedded in the polymer matrix; and
- a redistribution contact electrically connected with a chip contact by the film wiring line.

25. The reconstituted wafer according to claim 18, further comprising a passive electronic component adjacent a chipset and electrically connected to a film wiring line by a through polymer connector.

* * * * *